(12) United States Patent
Chakraborty

(10) Patent No.: US 9,948,309 B2
(45) Date of Patent: Apr. 17, 2018

(54) DIFFERENTIAL ODD INTEGER DIVIDER

(71) Applicant: Texas Instruments Incorporated, Dallas, TX (US)

(72) Inventor: Sudipto Chakraborty, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 188 days.

(21) Appl. No.: 14/541,578

(22) Filed: Nov. 14, 2014

(65) Prior Publication Data

US 2016/0142059 A1 May 19, 2016

(51) Int. Cl.
*H03K 23/00* (2006.01)
*H03K 23/70* (2006.01)
*H03K 3/012* (2006.01)

(52) U.S. Cl.
CPC ............ *H03K 23/70* (2013.01); *H03K 3/012* (2013.01)

(58) Field of Classification Search
CPC ...................................... H03K 23/70
USPC ......................................... 327/115
See application file for complete search history.

(56) References Cited

U.S. PATENT DOCUMENTS

| | | | | |
|---|---|---|---|---|
| 4,808,853 A * | 2/1989 | Taylor | ............... | H03K 19/09429 326/119 |
| 6,163,182 A * | 12/2000 | Canard | ................ | H03K 23/542 327/115 |
| 7,268,824 B2 * | 9/2007 | Suzuki | ...................... | H03L 7/00 327/158 |
| 8,487,669 B2 * | 7/2013 | Hesen | ..................... | H03K 21/12 327/115 |
| 8,519,742 B2 * | 8/2013 | Zhang | .............. | H03K 3/356121 326/46 |
| 8,754,719 B1 * | 6/2014 | O'Day | .................... | H03B 19/14 331/117 FE |
| 9,018,996 B1 * | 4/2015 | Zarei | ..................... | H04B 1/7176 327/115 |
| 2007/0176233 A1 * | 8/2007 | Ozawa | ................. | H01L 27/1203 257/335 |
| 2009/0167373 A1 * | 7/2009 | Song | ...................... | H03K 23/44 327/115 |
| 2010/0073027 A1 * | 3/2010 | Zhang | .............. | H03K 3/356121 326/68 |
| 2010/0134154 A1 * | 6/2010 | He | ....................... | H03K 23/544 327/115 |
| 2014/0321570 A1 * | 10/2014 | Mu | ......................... | H04L 25/08 375/285 |
| 2014/0361814 A1 * | 12/2014 | Connell | ................. | H03K 3/012 327/115 |

(Continued)

*Primary Examiner* — Ryan Jager
(74) *Attorney, Agent, or Firm* — Gregory J. Albin; Charles A. Brill; Frank D. Cimino

(57) ABSTRACT

A differential odd integer divider provides low power and compact sub-harmonics of an applied square or sinusoidal clock signal with self-aligned 50% duty cycle. The odd integer divider circuit includes a set of low power delay cells connected in a ring fashion. Each delay cell includes two differential dual port inputs connected to the gates of MOS transistors. For instance, these odd integer dividers include a series of low power latch circuits that are custom configured for minimum headroom and low power consumption. These output phasors can then be combined with an appropriate weight factor to provide a near-sinusoidal waveshape from the input square waveshape. Intrinsic 50% duty cycle maybe shortened or stretched by using combinatorial logic circuits.

3 Claims, 4 Drawing Sheets

(56) References Cited

U.S. PATENT DOCUMENTS

2014/0361821 A1* 12/2014 Connell .......... H03K 3/356104
                                                        327/218
2016/0118967 A1* 4/2016 Krishnamurthy ..... H02M 3/157
                                                        327/158

\* cited by examiner

DIFFERENTIAL ODD INTEGER DIVIDER

TECHNICAL FIELD

This invention relates generally to circuits for executing differential odd integer division.

BACKGROUND

Communication devices of various kinds rely on various circuitry to control parameters of wireless communication. Part of this process includes tuning the antenna portion of the communication device to be able to communicate at particular frequencies. Similarly, various circuitry relies on receipt of certain clock signals at particular frequencies to facilitate proper operation of the circuit at designated frequency bands. Additionally, there can be an advantage to having such clock signals being issued at harmonics or sub-harmonics of a given fundamental frequency. This is especially beneficial where multiple clock frequencies can be derived from the same high speed oscillators.

Accordingly, in such radio/high frequency clocking systems, there is a need to provide various circuit blocks with an oscillating signal with a frequency that is an odd sub-harmonic of a fundamental oscillating signal, i.e., clock, using low power and a compact implementation. In addition to a lower output frequency, multiple output phases can allow for a variety of signal processing capabilities in the high speed circuits and systems. Current solutions to saving the external bill of materials (BOM) for modern radio frequency (RF) transceivers operating at low frequency exist with large power and area analog filters. In one approach, extensive on-chip filtering aided by process and temperature calibration/compensation can be applied using clocks operating with single phase logic, but this approach is prone to imbalance at high frequency. In another approach, RF filtering using high quality factor (Q) external components are applied to reject harmonics of a local oscillator (LO) signal, but this approach is prone to component variation for the external filters. Moreover, both of these techniques increase the overall cost of the solution in power, area, and/or external components.

SUMMARY

Generally speaking, and pursuant to these various embodiments, a differential odd integer divider provides low power and compact sub-harmonics of an applied clock signal. The odd integer divider circuit includes a set of low power delay cells connected in a ring fashion. Each delay cell includes differential dual port inputs connected to the gates of MOS transistors. This approach allows use of the high frequency LO waveforms with lower signal amplitude than the typical rail-to-rail CMOS input levels, which is suitable for interfacing with high speed current mode logic (CML) signals. The proposed odd integer divider obtains phasors that are $2\pi/N$ degrees apart from each other, where N denotes the division factor. In one example, these odd integer dividers include a series of compact latch circuits that are custom configured for minimum headroom and low power consumption. These phasors may then be combined with an appropriate weight factor to obtain a near-sinusoidal waveshape from the input square waveshape. These weight factors are based on trigonometrical formulae, and the division order, N. Hence, this technique provides a low power, low area alternative of an on-chip filtering technique to obtain sinusoidal waveform from a square waveform.

Because the described dividers are fully differential in nature, they present symmetric loading to their driver circuitry, especially voltage controlled oscillator (VCO), and are immune to any common mode on-chip noise. Also, in one approach, the described solution does not use combinatorial logic at high frequency, thereby reducing power consumption. These and other benefits may become clearer upon making a thorough review and study of the following detailed description.

BRIEF DESCRIPTION OF THE DRAWINGS

The above needs are at least partially met through provision of the differential odd integer divider described in the following detailed description, particularly when studied in conjunction with the drawings wherein.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above except where different specific meanings have otherwise been set forth herein.

DETAILED DESCRIPTION

Figure 1:
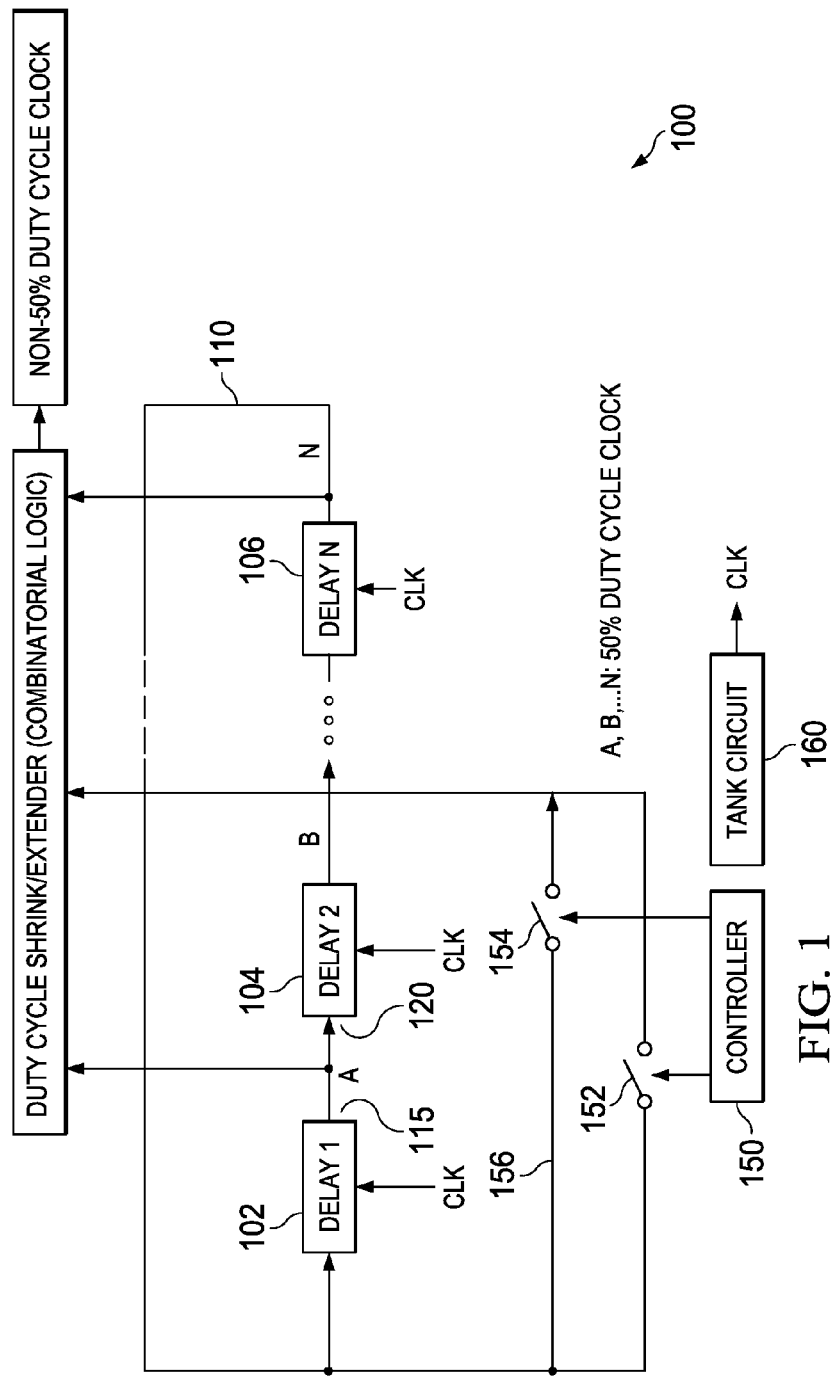
FIG. 1 comprises a block diagram of an example divider circuit as configured in accordance with various embodiments of the invention.

Referring now to the drawings and, in particular, FIG. 1, an example apparatus 100 for performing odd-integer division in a radio or high frequency clocking systems receiver will be described. The apparatus includes a set of N delay cells 102, 104, 106 connected in a ring 110 with an output 115 of one delay cell electrically connected to an input 120 of a next delay cell in the ring 110. Generally speaking, the delay cells are latch circuits that are custom configured for minimum headroom and low power consumption with differential inputs for receiving the output from the previous delay cell and an input clock signal.

Generally speaking, individual ones of the delay cells include a dual port output having a first output port and a second output port. The custom latch circuit portion includes a first switch and a second switch having source terminals respectively connected to a power voltage VDD or a ground voltage. The first switch and the second switch both are either NMOS transistors with source terminals connected to the ground voltage (illustrated in FIG. 3) or PMOS transistors with sources connected to the power voltage VDD (illustrated in FIG. 2). A ring 110 will have all its delay cells being of either the NMOS type (illustrated in FIG. 2) or all the PMOS type (illustrated in FIG. 3). The first switch's gate is electrically connected to a first electrical node connected to the second switch's drain and the second output port. The second switch's gate is electrically connected to a second electrical node connected to the first switch's drain and the first output port.

Figure 2:
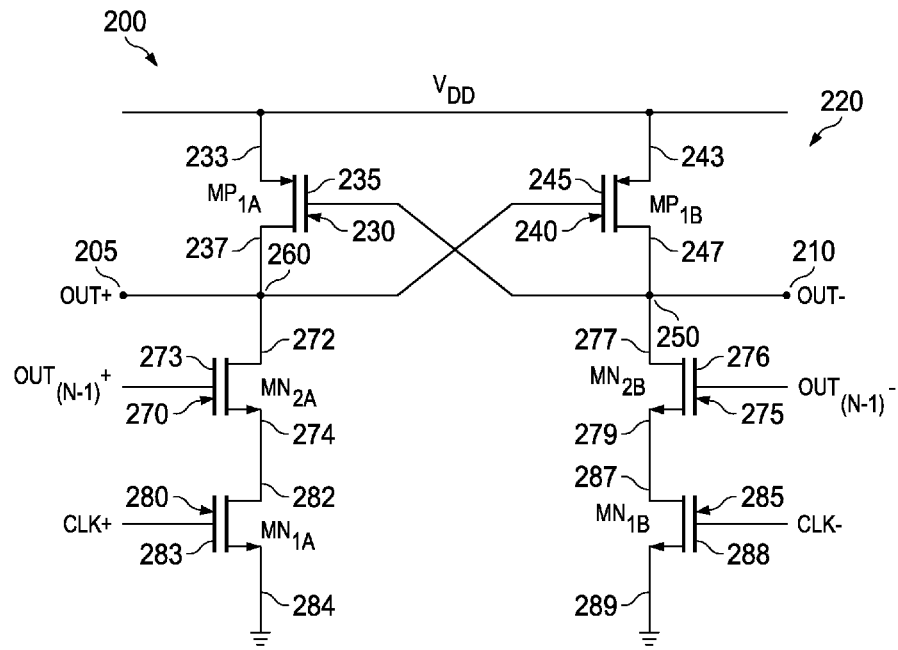
FIG. 2 comprises a circuit diagram of one cell of an example divider circuit as configured in accordance with various embodiments of the invention.

With reference to FIG. 2, an example NMOS version of a delay cell N 200 will be described. Individual ones of the delay cells include a dual port output having a first output port 205 and a second output port 210. The custom latch circuit portion 220 includes a first switch 230 and a second switch 240 having source terminals 233 and 243 respectively connected to a power voltage VDD. The first switch 230 and the second switch 240 both are PMOS transistors with sources 233 and 243 connected to the power voltage VDD. The first switch's gate 235 is electrically connected to a first electrical node 250 connected to the second switch's drain 247 and the second output port 210. The second switch's gate 245 is electrically connected to a second electrical node 260 connected to the first switch's drain 237 and the first output port 205.

The delay cell 200 also includes dual port differential inputs CLK+, CLK−, $OUT_{N-1}+$, and $OUT_{N-1}-$. These can be termed as the "clock" signal and the "set/reset" input signal. Depending on the state of the clock and the set/reset signals, the differential outputs are hard-switched by the latches, which are implemented in a complementary manner and such that a full rail to rail signal at the output can be obtained.

In one approach, the inputs to the N-th delay stage include a first positive input port $OUT_{N-1}+$ connected to a gate 273 of a first input positive switch transistor 270 having a first input positive switch transistor drain 272 electrically connected to the second electrical node 260. This first positive input port $OUT_{N-1}+$ is connected to receive the output from the positive output port of the immediately preceding delay cell N−1. A first negative input port $OUT_{N-1}-$ is connected to a gate 276 of a first input negative switch transistor 275 having a first input negative switch transistor drain 277 electrically connected to the first electrical node 250. This first negative input port OUT.sub.N−1− is connected to receive the output from the negative output port of the immediately preceding delay cell N−1. Generally speaking, the first positive and negative input switch transistors 270 and 275 comprise either NMOS (illustrated in FIG. 2) or PMOS (illustrated in FIG. 3) transistor types with sources connected to the drain terminals of the second positive and negative input switches respectively.

The dual port differential inputs further include a second positive input port CLK+ connected to a gate 283 of a second input positive switch transistor 280 having a second input positive switch transistor source 284 electrically connected to the ground voltage, and a drain 282 electrically connected to the first input positive switch transistor source 274. A second negative input port CLK− is connected to a gate 288 of a second input negative switch transistor 285 having a second input negative switch transistor source 289 electrically connected to the ground voltage, and a second input negative switch transistor drain 287 connected to a second input negative switch transistor source 279. The second positive and negative input switch transistors 280 and 285 both comprise NMOS transistors with their sources connected to the ground voltage.

Figure 3:
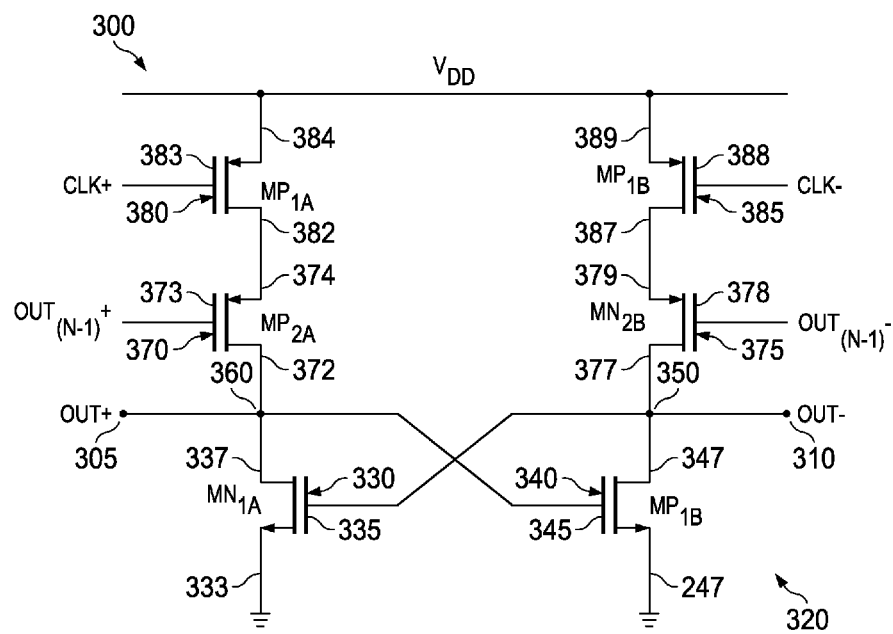
FIG. 3 comprises a circuit diagram of one cell of another example divider circuit as configured in accordance with various embodiments of the invention.

An example PMOS version of a delay cell N 300 will be described with reference to FIG. 3. Individual ones of the delay cells include a dual port output having a first output port 305 and a second output port 310. The custom latch circuit portion 320 includes a first switch 330 and a second switch 340 having source terminals 333 and 343 respectively connected to a ground voltage. The first switch 330 and the second switch 340 both are NMOS transistors with source terminals 333 and 343 connected to the ground voltage. The first switch's gate 335 is electrically connected to a first electrical node 350 connected to the second switch's drain 347 and the second output port 310. The second switch's gate 345 is electrically connected to a second electrical node 360 connected to the first switch's drain 337 and the first output port 305.

The delay cell 300 also includes dual port differential inputs CLK+, CLK−, $OUT_{N-1}+$, and $OUT_{N-1}-$. These can be termed as the "clock" signal and the "set/reset" input signal. Depending on the state of the clock and the set/reset signals, the differential outputs are hard-switched by the latches, which are implemented in a complementary manner and such that a full rail to rail signal at the output can be obtained.

In the illustrated approach, the inputs to the N-th delay stage include a first positive input port $OUT_{N-1}+$ connected to a gate 373 of a first input positive switch transistor 370 having a first input positive switch transistor drain 372 electrically connected to the second electrical node 360. This first positive input port $OUT_{N-1}+$ is connected to receive the output from the positive output port of the immediately preceding delay cell N−1. A first negative input port $OUT_{N-1}-$ is connected to a gate 378 of a first input negative switch transistor 375 having a first input negative switch transistor drain 377 electrically connected to the first electrical node 350. This first negative input port $OUT_{N-1}-$ is connected to receive the output from the negative output port of the immediately preceding delay cell N−1. The first positive and negative input switch transistors 370 and 375 comprise PMOS transistor types with sources connected to the drain terminals of the second positive and negative input switches respectively.

The dual port differential inputs further include a second positive input port CLK+ connected to a gate 383 of a second input positive switch transistor 380 having a second input positive switch transistor source 384 electrically connected to the power voltage VDD, and a drain 382 electrically connected to the first input positive switch transistor source 374. A second negative input port CLK− is connected to a gate 388 of a second input negative switch transistor 385 having a second input negative switch transistor source 389 electrically connected to the power voltage VDD, and a second input negative switch transistor drain 387 connected to a second input negative switch transistor source 379. The second positive and negative input switch transistors 380 and 385 both comprise PMOS transistors with their sources connected to the power voltage VDD.

Although depending on the embodiment the second positive and negative input switch transistors both are either NMOS or PMOS transistors, they are not a same type as the first and second switches. In either arrangement, the second positive and negative input switch transistors are connected to receive positive and negative clock signal inputs, CLK+ and CLK−, respectively. A ring comprised of delay cells such as these described above optionally can also have a forward body bias scheme configured to improve speed of operation of the apparatus 100. The forward body bias technique applies a slightly higher/lower voltage on the "bulk" terminal for NMOS/PMOS transistors respectively, and reduces the threshold voltage. To utilize a forward body bias, the respective transistors should be placed in isolated NWELLs.

In operation, the second positive and negative input ports (or clock signal input ports) provide clock signals to the delay cell, and the first positive and negative input ports receive the outputs of previous stage. The latch 220 or 320 provides a rail to rail swing at the output with square waveshape, while the input can be a sinusoidal waveshape with amplitude lower than the supply rail.

The described odd integer dividers can be easily extended to include any odd integer, and in the case of realizing a programmable odd integer divider, several intermediate stages of a large odd integer divider may be bypassed to provide other division ratios. In such a case and with reference again to FIG. 1, a controller 150 may be configured to bypass individual ones of the set of delay cells 102, 104, 106 to effect a division of an input signal by a different divider based on a number of delay cells of the set of delay cells not bypassed. This can effected using simple switches 152 and 154 and bypass lines 156 between the delay cells 102, 104, 106. For example, a divide by 11 stage maybe bypassed with respect to two delay cells at a time to obtain divide by 9, 7, 5, or 3 structures, which are very beneficial for a multi-modulous divider for RF clock system generation.

The input to the delay cells can have a low voltage swing, which is beneficial to operate with lower power consumption at high frequencies. The input loading to the divider 100 consists of the input capacitance of NMOS transistors and can be resonated by an inductive tank circuit 160 at RF frequency. The output is a rail-to-rail large signal, leading to a simultaneous division as well as current-mode logic (CML) to Complementary metal oxide semiconductor (CMOS) level converter. Due to the presence of equal delay of N number of stages, the duty cycle at the output is maintained at 50%. The phase granularity is self-aligned (i.e., the structure provides an intrinsic 50% duty cycle by construction and neither adjustments or trimming with respect to process or temperature variations nor combinatorial logic operations are necessary to realize a 50% duty cycle outputs).

Optionally, the controller 150 may be configured to determine duty cycle clocks using known combinatorial logic and output from the set of delay cells 102, 104, 106. Various other duty cycled clocks may be obtained by known combinatorial logic from the above clocking system. Non-50% duty cycle waveforms are useful in high speed clocking system to provide non-overlapping clock phasors. The odd-integer divider described above provides 50% duty cycle overlapping waveforms. Combinatorial logic can be employed on two or multiple output phases with 50% duty cycle to obtain higher or lower duty cycle. For example, a logical "AND" operation of two overlapping waveforms leads to a smaller duty cycle, and a logical "OR" operation of two overlapping waveforms leads to a larger duty cycle compared to the duty cycle of original waveforms. Thus, starting from an intrinsic 50% duty cycle, a lower/higher than 50% duty cycle can be obtained by using combinatorial logic.

Figure 4:
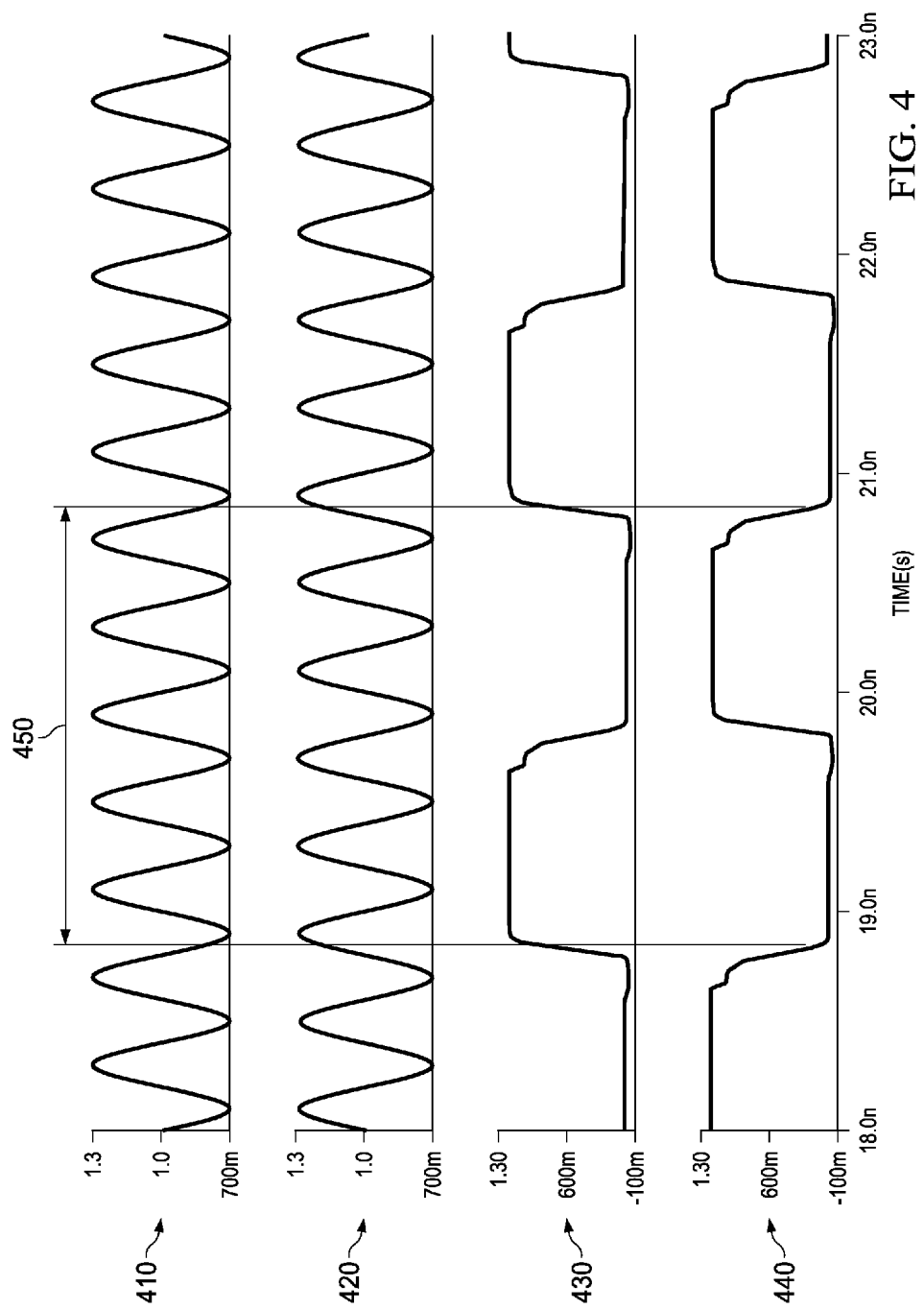
FIG. 4 comprises a graph of input and output waveforms for a five cell differential odd integer divider as configured in accordance with various embodiments of the invention.

FIG. 4 illustrates a variety of wave forms illustrating the simulated operation of a differential odd integer divider having five delay cells in the ring. The top two waveforms 410 and 420 are CLK− and CLK+ input signals, respectively, to the divider. In this case, the clock signals are sinusoidal input waveforms. The bottom two waveforms 430 and 440 are the OUT− and OUT+ output signal, respectively, from the divider. As illustrated over the time period 450, the output signals have a single period of a square wave form corresponding to five periods of the input signals.

Figure 5:
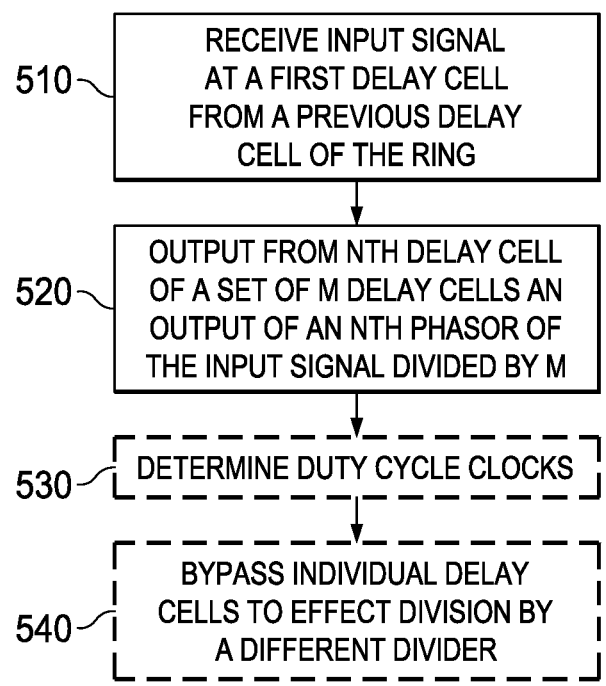
FIG. 5 comprises a flow diagram of an example method of operation for an apparatus configured in accordance with various embodiments of the invention.

This disclosure includes the method of performing odd-integer division in radio or high frequency clocking systems receiver. With reference to FIG. 5, such a method includes receiving 510 an input signal at a first delay cell of a set of delay cells connected in a ring with an output of one delay cell electrically connected to an input of a next delay cell in the ring. The structure of the set of delay cells is that described above and equivalent structures. The Nth delay cell of the set of delay cells (M) outputs 520 an output signal comprising an Nth phasor of the input signal divided by M. Optionally, duty cycle clocks are determined 530 using combinatorial logic and output from the set of delay cells. In another optional aspect, individual ones of the set of delay cells can be bypassed 540 to effect a division of an input signal by a different divider based on a number of delay cells of the set of delay cells not bypassed.

So configured, sub-harmonics can be produced at a low power cost and with minimal space addition. Other advantages include allowing the VCO to be operated at the lowest possible frequency band. For example, a transceiver operating at 170 MHz, 320 MHz, 900 MHz bands or the like currently require the VCO to operate at 900 MHz (and not higher). Accordingly, application of the described divider approach thereby reduces current consumption of the broadband blocks and resonates out transmitter power amplifier (TXPA) load at the highest frequency, leading to lowest power wideband transceiver architecture. Additional power savings are realized because only different phase operation is possible such that no redundant phases are generated (usually the transmitter section of the transceivers require only a differential signal, and I/Q LO signal generation is power/area efficient, and not necessary for transmitter). Moreover, the approach has a very low current draw because it inherently employs dynamic logic based circuit. The architecture also has a low area structure, lower routing parasitic characteristics, and offer better high frequency performance/lower power characteristics when compared to other known approaches.

Several other operational advantages can also be realized. For instance, the described approach also creates self-aligned generation of $2\pi/N$ phases, which can be used effectively at lower frequencies to provide harmonic rejection. Also, the divider is fully self-aligned at a 50% duty cycle and is easily extendable to further odd integer dividers, e.g., div 3, div 5, div 7, and the like. The approach also acts as a CML to CMOS level converter in that it can automatically convert a sinusoidal CML level input into a square waveform output, which is very desirable for high speed clock systems. Moreover, this is a fully modular approach, which is scalable across technologies and to bipolars. In addition, this approach provides a fully symmetrical loading to the high frequency VCO.

Those skilled in the art will recognize that a wide variety of modifications, alterations, and combinations can be made with respect to the above described embodiments without departing from the scope of the invention. Such modifications, alterations, and combinations are to be viewed as being within the ambient of the inventive concept.

What is claimed is:

1. A circuit for performing odd-integer frequency division of a first clock signal, having a set of six-transistor delay cells connected in a ring with an output of one six-transistor delay cell electrically connected to an input of a next six-transistor delay cell in the ring, wherein each six-transistor delay cell comprises:
   a first transistor having a first control terminal connected to a second output terminal and having a first current path connected between a first power supply terminal and a first output terminal;
   a second transistor having a second control terminal connected to the first output terminal and having a second current path connected between the first power supply terminal and the second output terminal;
   a third transistor having a third control terminal connected to a first output terminal of a previous six-transistor delay cell and having a third current path connected between the first output terminal of the respective six-transistor delay cell and a second power supply terminal;
   a fourth transistor having a fourth control terminal connected to a second output terminal of the previous six-transistor delay cell and having a fourth current path connected between the second output terminal of the respective six-transistor delay cell and the second power supply terminal;
   a fifth transistor having a fifth control terminal coupled to receive the first clock signal and having a fifth current path connected in series with the third current path; and
   a sixth transistor having a sixth control terminal coupled to receive a second clock signal and having a sixth current path connected in series with the fourth current path, wherein the circuit produces an output signal having a frequency of the first clock signal divided by an odd integer equal to a number of six-transistor delay cells in the set; and
   a controller configured to bypass individual ones of the set of six-transistor delay cells.

2. A circuit for performing odd-integer frequency division of a first clock signal, having a set of six-transistor delay cells connected in a ring with an output of one six-transistor delay cell electrically connected to an input of a next six-transistor delay cell in the ring, wherein each six-transistor delay cell comprises:
   a first transistor having a first control terminal connected to a second intermediate terminal and having a first current path connected between a first power supply terminal and a first intermediate terminal;
   a second transistor having a second control terminal connected to the first intermediate terminal and having a second current path connected between the first power supply terminal and the second intermediate terminal;
   a third transistor having a third control terminal connected to a first intermediate terminal from a previous six-transistor delay cell and having a third current path connected between the first intermediate terminal of the respective six-transistor delay cell and a second power supply terminal;
   a fourth transistor having a fourth control terminal connected to a second intermediate terminal from the previous six-transistor delay cell and having a fourth current path connected between the second intermediate terminal of the respective six-transistor delay cell and the second power supply terminal;
   a fifth transistor having a fifth control terminal coupled to receive the first clock signal and having a fifth current path connected in series with the third current path; and
   a sixth transistor having a sixth control terminal coupled to receive a second clock signal and having a sixth current path connected in series with the fourth current path, wherein the circuit produces an output signal having a frequency of the first clock signal divided by an odd integer equal to a number of six-transistor delay cells in the set; and
   a controller configured to bypass individual ones of the set of six-transistor delay cells to perform the odd-integer frequency division.

3. A method of performing odd-integer frequency division of a first clock signal with a set of six-transistor delay cells connected in a ring with an output of one six-transistor delay cell electrically connected to an input of a next six-transistor delay cell in the ring, comprising:
   receiving a first input signal at a first input transistor of a first six-transistor delay cell from a previous six-transistor delay cell;
   receiving a second input signal at a second input transistor of the first six-transistor delay cell from the previous six-transistor delay cell;
   forming a first current path from the first input transistor to a second power supply terminal in response to the first clock signal;
   forming a second current path from the second input transistor to the second power supply terminal in response to a second clock signal; and
   latching the first and second input signals from the respective first and second input transistors in a latch formed only by a first switch transistor and a second switch transistor connected to a first power supply terminal in response to the first and second input signals and the first and second clock signals, wherein the method produces an output signal having a frequency of the first clock signal divided by an odd integer equal to a number of six-transistor delay cells in the set; and
   selectively bypassing individual ones of the set of six-transistor delay cells to perform the odd-integer frequency division.

* * * * *